United States Patent
Bae et al.

(10) Patent No.: US 8,728,352 B2
(45) Date of Patent: May 20, 2014

(54) ELECTRICAL CONNECTION MATERIAL AND A SOLAR CELL INCLUDING THE SAME

(75) Inventors: Sang Sik Bae, Uiwang-si (KR); Kyoung Soo Park, Uiwang-si (KR); Kyoung Hun Shin, Uiwang-si (KR); Kang Bae Yoon, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 51 days.

(21) Appl. No.: 13/234,713

(22) Filed: Sep. 16, 2011

(65) Prior Publication Data
US 2012/0080068 A1    Apr. 5, 2012

(30) Foreign Application Priority Data
Oct. 5, 2010    (KR) .................. 10-2010-0096944

(51) Int. Cl.
- *H01B 1/00* (2006.01)
- *H01B 1/12* (2006.01)
- *H01L 31/042* (2006.01)
- *H01B 1/02* (2006.01)
- *H01B 1/22* (2006.01)
- *C08F 8/30* (2006.01)
- *C08L 75/00* (2006.01)

(52) U.S. Cl.
USPC .......... 252/500; 136/244; 252/512; 252/513; 252/514; 525/125

(58) Field of Classification Search
USPC ............. 136/244; 525/125, 127; 252/500, 252/512–514
See application file for complete search history.

(56) References Cited

U.S. PATENT DOCUMENTS

| | | | |
|---|---|---|---|
| 7,495,819 B2* | 2/2009 | Sakurai et al. | 359/296 |
| 8,163,835 B2 | 4/2012 | Park et al. | |
| 8,173,048 B2 | 5/2012 | Namkung et al. | |
| 2003/0008934 A1 | 1/2003 | Zychowski et al. | |
| 2006/0060824 A1* | 3/2006 | Yasumura et al. | 252/500 |
| 2009/0038675 A1* | 2/2009 | Tsunomura et al. | 136/251 |
| 2010/0148130 A1* | 6/2010 | Namkung et al. | 252/513 |

FOREIGN PATENT DOCUMENTS

| | | |
|---|---|---|
| CN | 1392154 A | 3/2009 |
| CN | 1475780 A | 7/2009 |
| JP | 7-147424 A | 6/1995 |
| JP | 11-323261 A | 11/1999 |
| JP | 2008-300403 A | 12/2008 |
| JP | 2009-283606 A | 12/2009 |
| TW | 201033316 A | 9/2010 |

OTHER PUBLICATIONS

Korean Office Action in KR 10-2010-0096944, dated Dec. 26, 2012 (Bae, et al.).
Chinese Office Action dated Aug. 20, 2013.
Chinese Office action dated Mar. 14, 2013 in CN 201110274676.6 (Bae, et al.).

* cited by examiner

*Primary Examiner* — Ling Choi
*Assistant Examiner* — Catherine S Branch
(74) *Attorney, Agent, or Firm* — Lee & Morse, P.C.

(57) ABSTRACT

An electrical connection material between conductors includes about 40 wt % to about 80 wt % of a urethane-modified acrylate resin, based on a total weight of the electrical connection material, the electrical connection material exhibiting, after curing, a tensile elongation of about 100% to about 500% and a yield point strain of about 10% to about 50% in a stress-strain curve.

17 Claims, 5 Drawing Sheets

Table 1

| | Example 1 | Example 2 | Example 3 | Example 4 | Example 5 | Example 6 |
|---|---|---|---|---|---|---|
| UM Resin 1 | 40 | 40 | 40 | 40 | 30 | 30 |
| UM Resin 2 | 30 | 30 | 20 | 20 | 20 | 20 |
| Thermoplastic resin 1 | 10 | 10 | 10 | 10 | 10 | - |
| Thermoplastic resin 2 | - | - | - | - | - | 10 |
| Acrylic copolymer | - | - | 10 | 10 | 20 | 20 |
| Radical poly. compound | 15 | 15 | 15 | 15 | 15 | 15 |
| Organic peroxide | 2 | 2 | 2 | 2 | 2 | 2 |
| Epoxy 1 | - | - | - | - | - | - |
| Epoxy 2 | - | - | - | - | - | - |
| Silica | - | - | - | - | - | - |
| Curing agent | - | - | - | - | - | - |
| Conductive particles 1 | 3 | - | 3 | - | 3 | 3 |
| Conductive particles 2 | - | 3 | - | 3 | - | - |
| Total | 100 | 100 | 100 | 100 | 100 | 100 |

FIG. 8

Table 2

| | Comparative Examples | | | | | |
|---|---|---|---|---|---|---|
| | 1 | 2 | 3 | 4 | 5 | 6 |
| UM Resin 1 | 35 | 35 | 40 | - | - | - |
| UM Resin 2 | - | - | 45 | - | - | - |
| Thermoplastic resin 1 | 10 | - | - | 40 | - | - |
| Thermoplastic resin 2 | - | 10 | - | 10 | - | - |
| Acrylic copolymer | 35 | 35 | - | 30 | - | - |
| Radical poly. compound | 15 | 15 | 10 | 15 | - | - |
| Organic peroxide | 2 | 2 | 2 | 2 | - | - |
| Epoxy 1 | - | - | - | - | 30 | 30 |
| Epoxy 2 | - | - | - | - | 20 | 20 |
| Silica | - | - | - | - | 7 | 7 |
| Curing agent | - | - | - | - | 40 | 40 |
| Conductive particles 1 | 3 | 3 | 3 | 3 | 3 | 3 |
| Conductive particles 2 | - | - | - | - | - | - |
| Total | 100 | 100 | 100 | 100 | 100 | 100 |

ELECTRICAL CONNECTION MATERIAL AND A SOLAR CELL INCLUDING THE SAME

FIELD

Example embodiments relate to an electrical connection material, and to a solar cell having a connection structure using the electrical connection material.

DESCRIPTION OF THE RELATED ART

In a manufacturing process of a, e.g., crystalline, solar cell module, a conductive wire, i.e., a ribbon, may be used to connect in series a plurality of solar cells. For example, each solar cell may include a silicon substrate with conductive electrodes thereon, e.g., aluminum or silver current collecting electrodes that collect electricity generated using incident light, and the conductive wire may be pressed to the electrodes on the solar cells to connect the cells in series.

SUMMARY

Embodiments are directed to an electrical connection material and to a solar cell having the same, which substantially overcome one or more of the problems due to the limitations and disadvantages of the related art.

Example embodiments provide an electrical connection material, including about 40 wt % to about 80 wt % of a urethane-modified acrylate resin, based on a total weight of the electrical connection material, the electrical connection material exhibiting, after curing, a tensile elongation of about 100% to about 500% and a yield point strain of about 10% to about 50% in a stress-strain curve.

The connection material may further include an elastic modulus of about 10 MPa to about 500 MPa at about 25° C. after curing.

The electrical connection material may exhibit a tensile elongation of about 200% to about 300% after curing.

The electrical connection material may include a polymer binder resin, the polymer binder resin having the urethane-modified acrylate resin, a radical polymerizable compound, an organic peroxide, and conductive particles.

The electrical connection material may include about 70 wt % to about 80 wt % of the polymer binder resin, based on a total weight of the electrical connection material, about 13 wt % to about 20 wt % of the radical polymerizable compound, based on a total weight of the electrical connection material, about 1 wt % to about 5 wt % of the organic peroxide, based on a total weight of the electrical connection material, and about 1 wt % to about 5 wt % of the conductive particles, based on a total weight of the electrical connection material.

The polymer binder resin may include the urethane-modified acrylate resin and at least one copolymer, the copolymer including at last one of an acrylonitrile butadiene copolymer, an ethylene-vinyl acetate copolymer, and an acrylic copolymer.

The polymer binder resin may include about 60 wt % to about 90 wt % of the urethane-modified acrylate resin and about 10 wt % to about 40 wt % of the copolymer, based on a total weight of the polymer binder resin.

The copolymer may include the acrylic copolymer, the acrylic copolymer having a glass transition temperature of about 50° C. to about 120° C.

The copolymer may include the acrylic copolymer, the acrylic copolymer having an acid value of about 1 mgKOH/g to about 100 mgKOH/g.

The radical polymerizable compound may include at least one of a urethane(meth)acrylate oligomer, an epoxy(meth)acrylate oligomer, a polyester(meth)acrylate oligomer, a fluorine(meth)acrylate oligomer, a fluorene(meth)acrylate oligomer, a silicone(meth)acrylate oligomer, a phosphorus (meth)acrylate oligomer, a maleimide modified(meth)acrylate oligomer, an acrylate oligomer, a methacrylate oligomer, and a (meth)acrylate monomer.

The organic peroxide may include at least one of a ketone peroxide, a peroxy ketal, a hydroperoxide, a dialkyl peroxide, a diacyl peroxide, a peroxyester, and a peroxy carbonate.

The conductive particles may include metal particles having Ni, Pd, Cu, Ag, Al, Ti, and/or Cr, and/or non-conductive particles coated with metal having Ni, Pd, Cu, Ag, Al, Ti, and/or Cr.

The polymer binder resin may include the urethane-modified acrylate resin and at least one thermoplastic resin.

The electrical connection material may further include a thermoplastic resin, a total combined amount of the urethane-modified acrylate resin and the thermoplastic resin in the electrical connection material being about 70 wt % to about 80 wt %, based on a total weight of the electrical connection material.

An amount of the urethane-modified acrylate resin may be at least 1.5 times larger than an amount of the thermoplastic resin.

The thermoplastic resin may be one of an acrylonitrile butadiene copolymer, an ethylene-vinyl acetate copolymer, and an acrylic copolymer Example embodiments also provide an electrical connection material, including about 40 wt % to about 80 wt % of a urethane-modified acrylate resin, based on a total weight of the electrical connection material, the electrical connection material exhibiting, after curing, an elastic modulus of about MPa 10 to about 500 MPa at about 25° C.

Example embodiments also provide a solar cell module having a plurality of solar cells connected via a connection structure, the connection structure including at least one electrode on a surface of each solar cell, a conductive wire connected to the electrodes on the plurality of solar cells, and an electrical connection material between the conductive wire and each of the electrodes, the electrical connection material comprising about 40 wt % to about 80 wt % of a urethane-modified acrylate resin, based on a total weight of the electrical connection material, and exhibiting, after curing, a tensile elongation of about 100% to about 500% and a yield point strain of about 10% to about 50% in a stress-strain curve.

The electrical connection material may be on a copper conductor, the copper conductor including on a surface thereof at least one of metal copper, rust-proofed copper or tin, solder, silver, and nickel.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0096944, filed on Oct. 5, 2010, in the Korean Intellectual Property Office, and entitled: "Electrical Connection Material Between Conductors and A Solar Cell Comprising the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
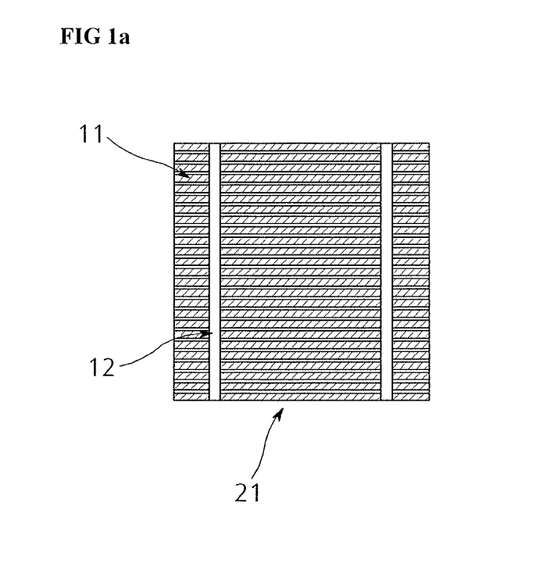
FIG. 1a illustrates a schematic view of a light receiving surface of a solar cell.
Figure 1B:
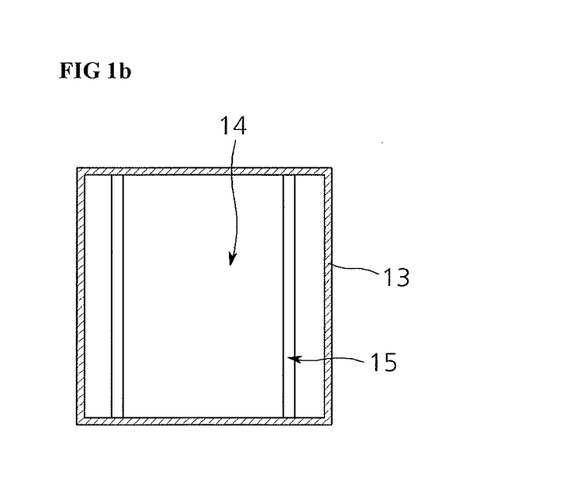
FIG. 1b illustrates a schematic view of a rear surface of a solar cell.

Referring to FIG. 1$a$, a solar cell 21 may include first front current collecting electrodes 11, i.e., finger leads, and second front current collecting electrodes 12, i.e., bus bars, on a light receiving surface, i.e., front surface, of a substrate 13 of the solar cell 21. A rear surface of the solar cell 21, as illustrated in FIG. 1$b$, may include a back side electrode 14, e.g., an aluminum electrode, and back current collecting electrodes 15 on the substrate 13. For example, the substrate 13 may be a polycrystalline silicon layer or wafer.

Figure 2:
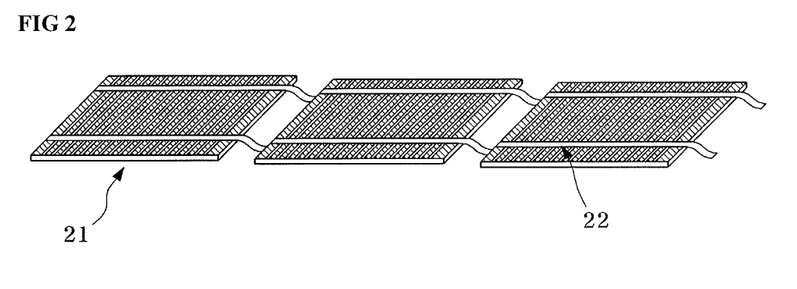
FIG. 2 illustrates a schematic view of a plurality of solar cells connected to each other via a ribbon.

As illustrated in FIG. 2, a plurality of solar cells 21 may be connected to each other via a conductive wire 22, i.e., a ribbon 22. The conductive wire 22, e.g., a copper wire, may be connected to the current collecting electrodes, as will be described in detail below with reference to FIG. 3. The conductive wire 22, e.g., a rectangular copper wire dipped in or plated with solder, may be thermally pressed, e.g., and soldered, along the current collecting electrodes, thereby connecting the plurality of solar cells 21 in series. For example, each solar cell 21 may have a size of about 12 $cm^2$ to about 16 $cm^2$.

Figure 3:
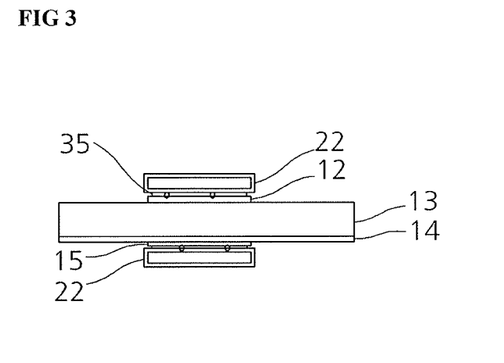
FIG. 3 illustrates a schematic view of a connection structure between a solar cell and a ribbon via an electrical connection material according to an example embodiment.

As illustrated in FIG. 3, the conductive wire 22 may be connected to the current collecting electrode, i.e., second front current collecting electrodes 12 and/or back current collecting electrodes 15, via an electrical connection material 35. For example, the conductive wire 22 may completely overlap a corresponding current collecting electrode, so the electrical connection material 35 may be disposed therebetween, e.g., in direct contact with each of the conductive wire 22 and the current collecting electrode. For example, the solar cell 21 may have a square shape having a size of about 16 $cm^2$, and the conductive wire 22 may be connected to the current collecting electrode along a connection length of about 15 cm with the electrical connection material 35 therebetween.

For example, the electrical connection material 35 may be disposed to a thickness of about 35 μm, followed by placement on a heat press. A silicone rubber having a thickness of about 0.2 mm may be disposed on the electrical connection material 35, followed by thermal pressing at 190° C. and 30 MPa for 15 minutes to cure the electrical connection material 35 into a cured film, i.e., layer.

As a copper ribbon, i.e., having a linear expansion coefficient of about ($16.8 \times 10^{-6}$/K), extends along about 15 cm on a silicon substrate, i.e., having a linear expansion coefficient of about ($2.4 \times 10^{-6}$/K), there may be a difference of about $14.4 \times 10^{-6}$/K in linear expansion coefficient between the ribbon and silicon wafer. If the current collecting electrode and the ribbon are connected to each other at about 200° C. through a solder paste deposited around the ribbon, and the connected ribbon uniformly contracts from the center thereof when cooling from about 200° C. to room temperature, an end portion of the ribbon in such a solar cell may deform due to the different linear expansion coefficients, i.e., a difference of about $14.4 \times 10^{-6}$/K×(200° C.−25° C.)×75 mm=0.189 mm. Such deformation may increase stress, which in turn, may cause serious bending of the conventional solar cell or potential breakage thereof after connection. Further, in heating and cooling cycle testing, the connected part may be separated or the cells may be broken Therefore, according to example embodiments, the electrical connection material 35 between the current collecting electrodes and the ribbon 22 may minimize the stress during formation and may exhibit improved reliability. The electrical connection material 35 may exhibit a tensile elongation of about 100% or more. For example, the electrical connection material 35 may exhibit a tensile elongation of about 100% to about 500%, e.g., about 200% to about 300%. The electrical connection material 35 may exhibit a yield point strain of about 10% or more, e.g., about 10% to about 50% in a stress-strain curve, and an elastic modulus of about 10 MPa to about 500 MPa at about 25° C., e.g., about 30 MPa to about 450 MPa at about 25° C., after curing, thereby enabling connection between the current collecting electrode on the solar cell 21 and the ribbon 22 within 5 seconds or less, while also providing excellent reliability.

The electrical connection material 35 for electrical connection between conductors, e.g., between the current collecting electrodes and the ribbon 22, may include a polymer binder resin, a radical polymerizable compound, an organic peroxide, and conductive particles. The electrical connection material 35 may include about 70% to about 85% by weight ("wt %") of the polymer binder resin, about 13 wt % to about 20 wt % of the radical polymerizable compound, about 1 wt % to about 5 wt % of the organic peroxide, and about 1 wt % to about 5 wt % of the conductive particles. It is noted that wt % of components in the electrical connection material 35 are based on a total dry weight of the electrical connection material 35, i.e., excluding a solvent.

Polymer Binder Resin

The polymer binder resin forms a binder part, which functions as a matrix for formation of a conductive film. For example, the polymer binder resin may include a thermoplastic resin.

For example, the polymer binder resin may include at least one of acrylonitrile, styrene-acrylonitrile, methyl methacrylate-butadiene-styrene, butadiene, acrylic, urethane, epoxy, phenoxy, polyamide, olefin, polyester, silicone resins, and combinations thereof. For example, the electrical connection material 35 may include a urethane-modified acrylate resin in, or as the, polymer binder resin.

The urethane-modified acrylate resin may be present in the electrical connection material 35 in an amount of about 40 wt % to about 80 wt %, based on a total weight of the electrical connection material 35. Within this range, appropriate film properties and enhanced reliability may be obtained. For example, the electrical connection material 35 may include the urethane-modified acrylate resin in an amount of about 50 wt % to about 70 wt % in order to allow the electrical connection material 35 to have low glass transition temperature, which in turn, improves flowability and exhibits high adhesion due to presence of a urethane group in a molecular chain thereof. In particular, when the urethane-modified acrylate resin is used in the electrical connection material 35 in the above amount, curing performance may be improved, which in turn, may decrease temperature in a connecting process.

Examples of a urethane-modified acrylate resin may include one or more of a diisocyanate, a polyol, a diol, and an acrylate component. The diiocyanate may include, e.g., aromatic, aliphatic, and alicyclic, diisocyanates, or mixtures thereof. The polyol may include, e.g., a polyester polyol, a polyether polyol, a polycarbonate polyol, and the like, which have at least two hydroxyl groups in a molecular chain thereof. The diol may include, e.g., 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, and the like. The acrylate compound may include compounds obtained by polymerization of, e.g., hydroxyl(meth)acrylate or amine(meth) acrylate.

For example, the urethane-modified acrylate resin may include all four compounds discussed above, i.e., a diisocyanate, a polyol, a diol, and an acrylate component, and may be formed by polyaddition, such that the mole ratio of isocyanate group (NCO) to hydroxyl group (OH) is about 1.04 to about 1.6, and the polyol content is about 70% or less among three components except for the acrylate compound, followed by a reaction of one terminal functional group of the urethane synthesized by the polyaddition reaction, i.e., one isocyanate group, with hydroxyl(meth)acrylate or amine(meth)acrylate in a mole ratio of about 0.1 to about 2.1. In addition, the remaining isocyanate groups are subjected to a reaction with alcohols, thereby producing the urethane-modified acrylate resin. Here, the polyaddition may be carried out by any typical method known in the art. Further, the polyaddition may be conducted at a temperature of about 90° C., and at a pressure of about 1 atm for about 5 hours using a tin-based catalyst, without being limited thereto.

In addition to the above urethane-modified acrylate resin, other thermoplastic resins, e.g., an acrylonitrile butadiene copolymer, an ethylene-vinyl acetate copolymer, and/or an acrylic copolymer, may be used as a mixture for the polymer binder resin forming the electrical connection material 35. For example, a mixture including a urethane-modified acrylate resin and another thermoplastic resin may be used to form the polymer binder resin.

As the other thermoplastic resin, any suitable acrylonitrile butadiene copolymer and any suitable ethylene-vinyl acetate copolymer may be used. Examples of commercially available acrylonitrile butadiene copolymers include 1072CGX, NX775, or the like (Zeon Chemicals), and examples of commercially available ethylene-vinyl acetate copolymers include EVA 700, EVA 800, and the like (Byer).

The acrylic copolymer, i.e., a thermoplastic resin that may be used as the polymer binder resin, may include acrylic copolymers obtained by polymerization of acrylic monomers, e.g., ethyl, methyl, propyl, butyl, hexyl, octyl, dodecyl, and lauryl(meth)acrylates, and modifications of acrylic monomers, e.g., acrylates, acrylic acids, methacrylic acids, methyl methacrylates, and vinyl acetates, without being limited thereto. The acrylic copolymer may have a glass transition temperature (Tg) of about 50° C. to about 120° C.

The acrylic copolymer may include a hydroxyl or carboxyl group, at an acid value of about 1 mgKOH/g to about 100 mgKOH/g, and may optionally, further include an epoxy or an alkyl group. If the glass transition temperature of the acrylic copolymer is less than 50° C., the cured film, i.e., the cured electrical connection material 35, becomes soft, resulting in inferior compressibility and a decreased connection reliability with urethane acrylate having a low glass transition temperature. If the glass transition temperature is greater than 120° C., the cured film is broken and is not formed properly. Further, if the acid value of the acrylic copolymer is less than 1 mgKOH/g, sufficient adhesion may not be obtained. If the acid value exceeds 100 mgKOH/g, connection reliability may be lowered due to corrosion.

For example, the acrylic copolymer may have a glass transition temperature of about 90° C. to realize strong film properties, and may have an acid value of about 3.4 mgKOH/g to act as a binder. It is noted that a polymer binder resin including a mixture of a urethane-modified acrylate resin and an acrylic copolymer may exhibit a higher glass transition temperature than a polymer binder resin including only urethane-modified acrylate resin, but such a mixture may exhibit an improved connection reliability.

As discussed previously, the polymer binder resin may be present in an amount of about 70 wt % to about 85 wt %, e.g., about 75 wt % to about 85 wt %, in the electrical connection material 35. Within this range, sufficient dispersibility may be secured in a process of dispersing the conductive particles, and excellent flowability may be obtained. As such, a stable connection state may be maintained.

The urethane-modified acrylate resin may be present in an amount of about 60 wt % to about 90 wt % in the polymer binder resin, based on a total weight of the polymer binder resin, e.g., in an amount of about 75 wt % to about 90 wt %. At least one copolymer of the acrylonitrile butadiene copolymer, the ethylene-vinyl acetate copolymer, and the acrylic copolymer may be present in the polymer binder resin in an amount of about 10 wt % to about 40 wt %, based on a total weight of the polymer binder resin, e.g., about 10 wt % to about 25 wt %. Within this range, excellent reworkability may be obtained after pressurization in a pressing process, and the film may not separate when pressurized.

Radical Polymerizable Compound

The radical polymerizable compound functions as a curing agent to ensure adhesion and connection reliability between connected layers when radical curing reaction occurs. The radical polymerizable compound of the electrical connection material 35 may include at least one vinyl group and at least one of a (meth)acrylate oligomer and a (meth)acrylate monomer.

As the (meth)acrylate oligomer, any suitable (meth)acrylate oligomer may be used, e.g., urethane(meth)acrylates, epoxy(meth)acrylates, polyester(meth)acrylates, fluorine (meth)acrylates, fluorene(meth)acrylates, silicone(meth) acrylates, phosphorus(meth)acrylates, maleimide modified (meth)acrylates, and acrylates (methacrylates), which has a weight average molecular weight in the range of about 1,000 g/mol to about 100,000 g/mol.

For example, the urethane(meth)acrylate oligomer may include molecules with an intermediate structure synthesized from polyester polyol, polyether polyol, polycarbonate polyol, polycaprolactone polyol, a ring-opened tetrahydrofuran-propyleneoxide copolymer, polybutadiene diol, polydimethylsiloxane diol, ethylene glycol, propylene glycol, 1,4-butanediol, 1,5-pentanediol, 1,6-hexanediol, neopentyl glycol, 1,4-cyclohexane dimethanol, bisphenol A, hydrogenated bisphenol A, 2,4-toluene diisocyanate, 1,3-xylene diisocyanate, 1,4-xylene diisocyanate, 1,5-naphthalene diisocyanate, 1,6-hexane diisocyanate, isophorone diisocyanate, and bisphenol A propyleneoxide modified diacrylate. The epoxy(meth)acrylate oligomer may include, e.g., molecules with an intermediate structure synthesized of 2-bromohydroquinone, resorcinol, catechol, bisphenols, such as bisphenol-A, bisphenol-F, bisphenol-AD and bisphenol-S, 4,4'-dihydroxybiphenyl and bis(4-hydroxyphenyl)ether; and a (meth)acrylate oligomer having alkyl, aryl, methylol, allyl, cycloaliphatic, halogen (tetrabromobisphenol A), or nitro groups.

In addition, the (meth)acrylate oligomer may include compounds containing at least two maleimide groups in the molecule, e.g., 1-methyl-2,4-bismaleimidebenzene, N,N'-m-phenylenebismaleimide, N,N'-p-phenylenebismaleimide, N,N'-m-tolylene bismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfone bismaleimide, 2,2-bis[4-(4-maleimidophenoxy)phenyl]propane, 2,2-bis[3-s-butyl-4-8(4-maleimidophenoxy)phenyl]propane, 1,1-bis[4-(4-maleimidophenoxy)phenyl]decane, 4,4'-cyclohexylidene-bis[1-(4-maleimidophenoxy)-2-cyclohexyl]benzene, 2,2-bis[4-(4-maleimidophenoxy)phenyl)hexafluoropropane, etc.

As the (meth)acrylate monomer, any suitable (meth)acrylate monomer may be used, e.g., 1,6-hexanediol mono(meth)acrylate, 2-hydroxyethyl(meth)acrylate, 2-hydroxypropyl(meth)acrylate, 2-hydroxybutyl(meth)acrylate, 2-hydroxy-3-phenyloxypropyl(meth)acrylate, 1,4-butanediol(meth)acrylate, 2-hydroxyalkyl(meth)acryloyl phosphate, 4-hydroxycyclohexyl(meth)acrylate, neopentylglycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acrylate, glycerol di(meth)acrylate, t-hydrofurfuryl(meth)acrylate, isodecyl(meth)acrylate, 2-(2-ethoxyethoxy)ethyl(meth)acrylate, stearyl(meth)acrylate, lauryl(meth)acrylate, 2-phenoxyethyl(meth)acrylate, isobornyl(meth)acrylate, tridecyl(meth)acrylate, ethoxylated nonylphenol(meth)acrylate, ethyleneglycol di(meth)acrylate, diethyleneglycol di(meth)acrylate, triethyleneglycol di(meth)acrylate, t-ethyleneglycol di(meth)acrylate, polyethyleneglycol di(meth)acrylate, 1,3-butyleneglycol di(meth)acrylate, tripropyleneglycol di(meth)acrylate, ethoxylated bisphenol-A di(meth)acrylate, cyclohexanedimethanol di(meth)acrylate, phenoxy-t-glycol(meth)acrylate, 2-methacryloyloxyethyl phosphate, dimethylol tricyclodecane di(meth)acrylate, trimethylol-propanebenzoate acrylate, fluorene(meth)acrylate, acid phosphoxyethyl methacrylate, etc.

The radical polymerizable compound may be present in the electrical connection material 35 in an amount of about 13 wt % to about 20 wt %, e.g., about 13 wt % to about 18 wt %. Within this range, excellent reliability and overall flowability may be secured, after a pressing process. As such, contact resistance may not increase.

Organic Peroxide

The organic peroxide is a polymerization initiator, which serves as a curing agent generating free radicals when heated or exposed to light. The organic peroxide may include, without being limited to, ketone peroxides, peroxy ketals, hydroperoxides, dialkyl peroxides, diacyl peroxides, peroxyesters, and peroxy carbonates. The organic peroxides may be used as mixtures in view of contact temperature and time, and storage stability.

Examples of the organic peroxide may include, without being limited to, t-butylperoxylaurate, 1,1,3,3-t-methylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate, dicumyl peroxide, 2,5-dimethyl-2,5-di(t-butylperoxy)hexane, t-butylcumylperoxide, t-hexyl peroxyneodecanoate, t-hexylperoxy-2-ethylhexanonate, t-butylperoxy-2-2-ethylhexanonate, t-butylperoxyisobutyrate, 1,1-bis(t-butylperoxy)cyclohexane, t-hexyl peroxyisopropylmonocarbonate, t-butylperoxy-3,5,5-trimethylhexanonate, t-butylperoxypivalate, cumylperoxy-neodecanoate, diisopropylbenzenehydroperoxide, cumene hydroperoxide, isobutylperoxide, 2,4-dichlorobenzoylperoxide, 3,5,5-trimethylhexanoylperoxide, octanoylperoxide, lauroylperoxide, stearoylperoxide, succinic peroxide, benzoylperoxide, 3,5,5-trimethylhexanoylperoxide, benzoylperoxytoluene, 1,1,3,3-tetramethylbutylperoxyneodecanoate, 1-cyclohexyl-1-methylethylperoxyneodecanoate, di-n-propylperoxydicarbonate, diiso-propylperoxycarbonate, bis(4-t-butylcyclohexyl)peroxydicarbonate, di-2-ethoxymethoxyperoxydicarbonate, di(2-ethylhexylperoxy)dicarbonate, dimethoxy-butylperoxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilylperoxide, bis(t-butyl)dimethylsilylperoxide, t-butyltriallylsilylperoxide, bis(t-butyl)diallylsilylperoxide, and tris(t-butyl)allylsilylperoxide.

As the organic peroxide, a compound having a half-life temperature at 40° C. to about 100° C. within about 5 hours to about 15 hours may used. If the half-life temperature of the organic peroxide is too low, its decomposition rate is fast, causing difficulties in storage at room temperature. If the half-life temperature is excessively high, a polymerization rate becomes too slow, which is not proper for quick curing. The organic peroxide may be present in the electrical connection material 35 in an amount of about 1 wt % to about 5 wt %, e.g., about 1 wt % to about 3 wt %, in order to balance curing properties of an adhesive and storage of the adhesive.

Conductive Particles

The electrical connection material 35 between conductors having the above components may include conductive particles. The conductive particles may be employed as fillers to impart conductive performance to a composition of a conductive film, i.e., the electrical connection material 35. The conductive particle may include, without being limited to, metal particles, e.g., particles formed of at least one of Ni, Pd, Cu, Ag, Al, Ti, Cr, or particles prepared by coating non-conductive particles with the above metal materials, and the like.

The conductive particle may have a size of about 2 μm to about 30 μm depending on employed electrodes and purposes. The conductive particle may be present in an amount of about 1 wt % to about 5 wt %, e.g., about 1 wt % to about 4 wt %, in the electrical connection material 35. Within this range, defective connection may be avoided during a connecting process.

Other Components

The electrical connection material 35 between conductors according to the example embodiments may further include a pigment for coloring, a dye, a polymerization inhibitor, a silane coupling agent, or the like in view of properties or workability of a product in order to obtain desired properties of the cured product. These components may be included in a suitable amount.

According to example embodiments, the electrical connection material 35 may exhibit, after curing, a tensile elongation of about 100% or more, a yield point strain of about 10% or more in a stress-strain curve, and an elastic modulus of about 10 MPa to about 500 MPa at 25° C. The electrical connection material 35 may be realized as a conductive film or paste for a semiconductor device. If the electrical connection material 35 is used as a conductive film, the thickness of the film may be about 1 µm to about 50 µm.

The electrical connection material 35 is well suited to connection of the solar cells 21 of a semiconductor solar cell module in an FPD module, a connection of a COF having a driver IC on a polyimide substrate with a glass substrate, a glass epoxy substrate or other plastic substrates, and the like. Meanwhile, one of the conductors to be connected using the electrical connection material 35, e.g., one of the current collecting electrodes or ribbon 22, may be copper surface-treated with at least one metal of copper, rust-proofed copper or tin, solder, silver, and nickel.

A conductive film formed of the electrical connection material 35 may be formed by any suitable device or equipment. For example, the conductive film may be formed through the following process. A polymer binder resin may be dissolved in an organic solvent and liquefied, and then the remaining components may be added thereto and stirred for a predetermined time. The product may be applied to a release film to a thickness of about 10 µm to about 50 µm and dried over a predetermined time to volatilize the organic solvent, thereby producing a conductive film having a single layer structure. Here, the organic solvent may be any suitable organic solvent. Then, the foregoing process may be repeated, thereby preparing a conductive film having a multilayer structure, e.g., at least two layers or more.

A solar cell of the example embodiments may have a connection structure using the electrical connection material.

Hereinafter, embodiments will be described in detail with reference to examples and comparative examples. However, it should be noted that these examples are given by way of illustration only and do not limit the scope of the embodiments.

EXAMPLES

Figure 7:
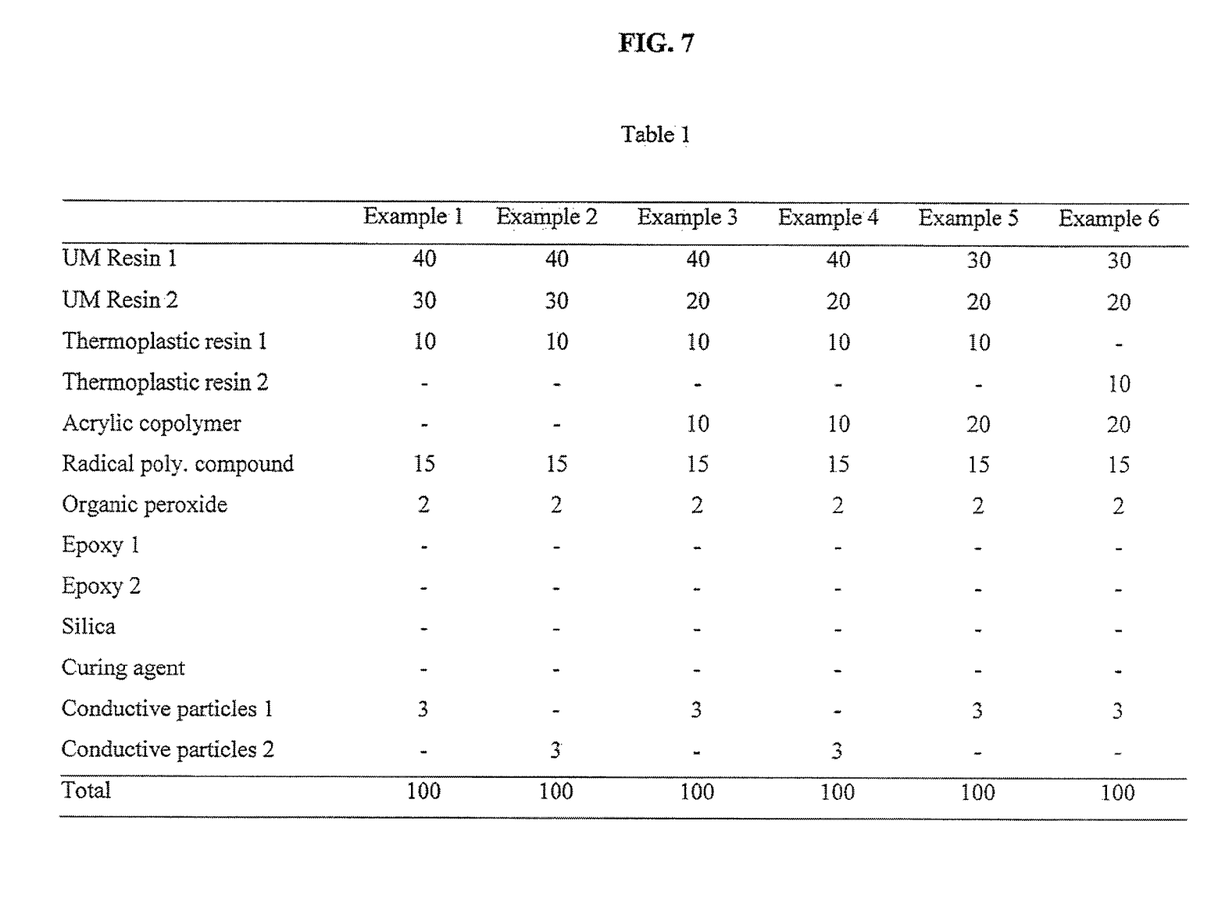
FIG. 7 illustrates Table 1 summarizing compositions of Examples 1-6.
Figure 8:
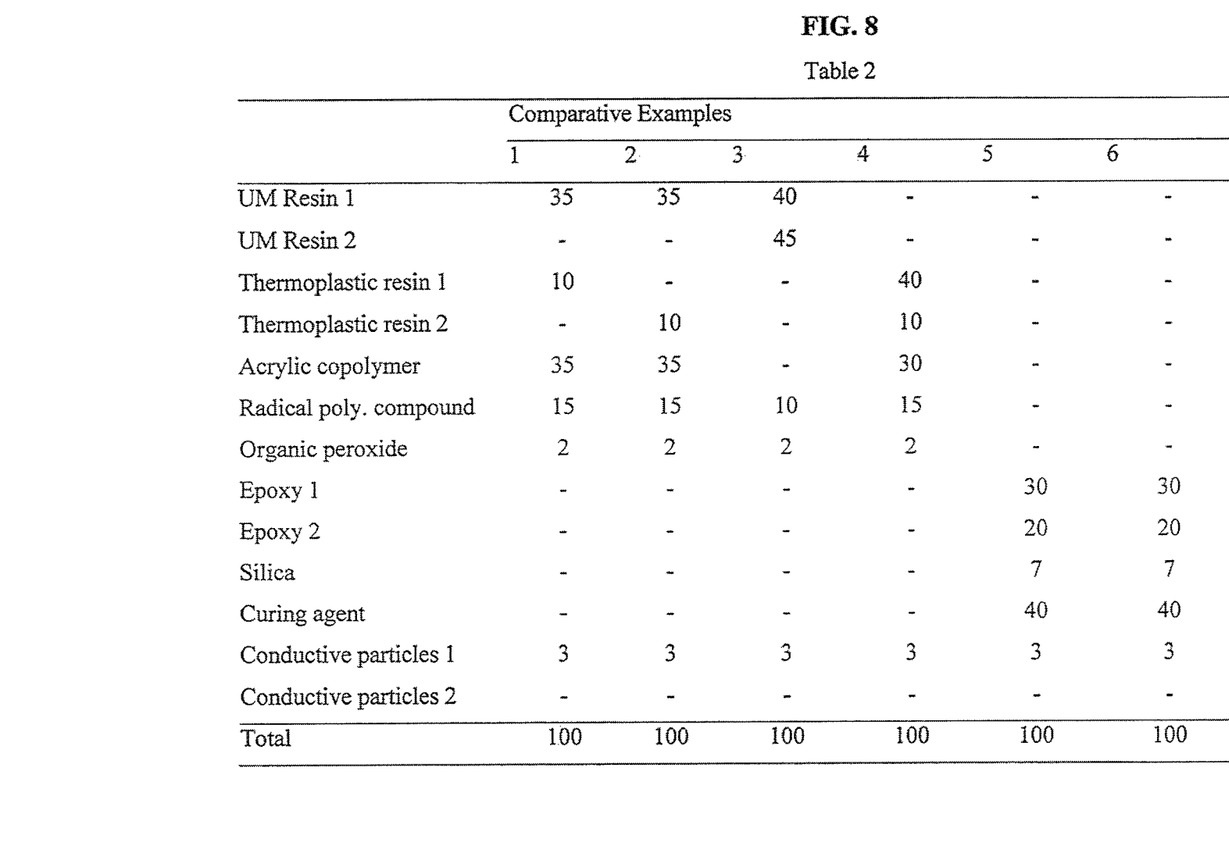
FIG. 8 illustrates Table 2 summarizing compositions of Comparative Examples 1-6.

Compositions of an electrical connecting material for connecting conductors were prepared according to example embodiments, i.e., Example 1 through Example 6, and according to conventional art, i.e., Comparative Examples 1 through 6. The contents of the compositions are summarized in FIG. 7, i.e., Table 1 summarizing Examples 1-6, and FIG. 8, i.e., Table 2 summarizing Comparative Examples 1-6. Details regarding each component in Tables 1-2, i.e., each component of Examples 1 to 6 and Comparative Examples 1 to 6, are as follows.

UM Resin 1 refers to a urethane-modified acrylate resin 1. UM Resin 1 was synthesized using 60 wt % of polytetramethylene glycol, 39.97 wt % of three components, i.e., 1,4-butanediol, toluene diisocyanate and hydroxyethyl methacrylate, and 0.03 wt % of dibutyltin dilaurate as a catalyst. First, the polytetramethylene glycol, 1,4-butanediol, and toluene diisocyanate were reacted to synthesize an isocyanate-terminated prepolymer. The isocyanate-terminated prepolymer was further reacted with hydroxyethyl methacrylate to prepare a polyurethane acrylate resin, such that the mole ratio of hydroxyethyl methacrylate/isocyanate-terminated prepolymer was 0.5. The reaction was carried out by polyaddition at 90° C. and a pressure of 1 atm for 5 hours in the presence of dibutyltin dilaurate as a catalyst, thereby synthesizing polyurethane acrylate having a weight average molecular weight of 25,000 g/mol.

UM Resin 2 refers to urethane-modified acrylate resin 2. UM Resin 2 was synthesized using 60 wt % of polytetramethylene glycol, 39.97 wt % of three components, i.e., 1,4-butanediol, toluene diisocyanate and hydroxyethyl methacrylate, and 0.03 wt % of dibutyltin dilaurate as a catalyst. First, the polytetramethylene glycol, 1,4-butanediol, and toluene diisocyanate were reacted to synthesize an isocyanate-terminated prepolymer. The isocyanate-terminated prepolymer was further reacted with hydroxyethyl methacrylate to prepare a polyurethane acrylate resin, wherein the mole ratio of hydroxyethyl methacrylate/isocyanate-terminated prepolymer was 1. The reaction was carried out by polyaddition at 90° C. and a pressure of 1 atm for 5 hours in the presence of dibutyltin dilaurate as a catalyst, thereby synthesizing polyurethane acrylate having a weight average molecular weight of 28,000 g/mol.

The thermoplastic resin 1 was acrylonitrile butadiene copolymer (1072CGX, Zeon Chemicals) dissolved in toluene/methyl ethyl ketone in 25% by volume (v %). The thermoplastic resin 2 was ethylene-vinyl acetate copolymer (EVA 700, Byer) dissolved in toluene/methyl ethyl ketone in 40 by volume (v %).

The acrylic copolymer used had a weight average molecular weight of 90,000 to 120,000 g/mol (AOF7003, Aekyung Chemical), and was dissolved in toluene/methyl ethyl ketone in 40 v %

The radical polymerizable compound used was epoxy acrylate polymer (SP1509, Showa Highpolymer).

The organic peroxide used was benzoylperoxide.

The epoxy resin 1 was BPA epoxy resin (Kukdo Chemical), and the epoxy resin 2 was an epoxy resin containing polycyclic aromatic rings (HP4700, Dainippon Ink and Chemicals).

The silica used was nano-silica (R972, Degussa). Latent curing agent was micro-capsulated imidazole (HX3941HP, Asahi Kasei).

The conductive particles 1 were nickel-coated copper particles having a size of 5 µm. The conductive particles 2 were silver-coated copper particles having a size of 5 µm The components in Examples 1-6 and Comparative Examples 1-6 were mixed according to compositions listed in parts by weight in Tables 1 and 2, and were dissolved and dispersed in an organic solvent using a planetary mixer. The mixture was applied to a peeled PET film, and the solvent was dried for 5 minutes using a convection oven heated to 60° C., thereby producing two types of connecting films having a thickness of 25 µm and a thickness of 35 µm, respectively.

Tests for Evaluation of Properties

Figure 4:
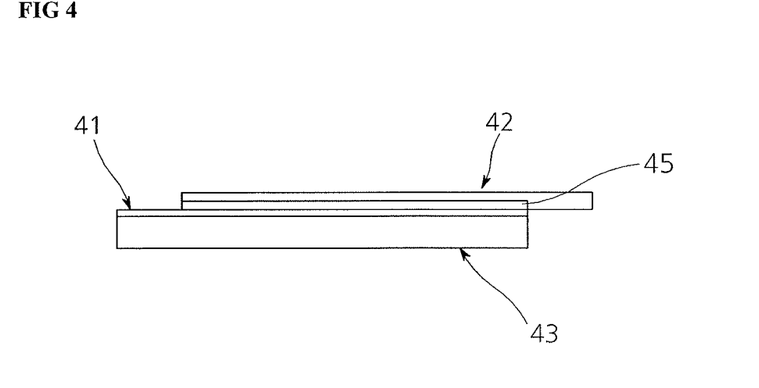
FIG. 4 illustrates a connection structure including an electrical connection material used in a connection reliability test of the examples.

To measure connection reliability, each of the connecting films having a thickness of 25 µm produced in Examples 1 to 6 and Comparative Examples 1 to 6 was slit into pieces having a width of 1 mm and a length of 15 cm, and each piece (connecting film 45 in FIG. 4) was attached to a current collecting electrode on a crystalline silicon cell (current collecting electrode 41 on a silicon substrate 43 in FIG. 4), one side of which was 158 mm-long, at 80° C. and 1 MPa for 2 seconds. After removing the PET film, a rectangular copper wire (1.5 mm in width, 0.2 mm in height, and 180 mm in length) coated with solder through dipping was disposed on the connecting film (wire 42 on connecting film 45 in FIG. 4) and thermally pressed at 150° C. and 1 MPa for 5 or 3 seconds, thereby preparing a sample for measurement of connection reliability.

To perform a tensile test and measure elastic modulus, each of the connecting films having a thickness of 35 μm was placed on a heat press, and silicone rubber having a thickness of 0.2 mm was disposed thereon, followed by thermal pressing at 190° C. and 30 MPa for 15 minutes to cure the connecting film. Then, after removing the release film, the connecting film was cut into samples having a width of 2 mm and a length of 30 mm for the tensile test and into samples having a width of 5 mm and a length of 30 mm for measurement of elastic modulus.

Although elastic modulus can be measured from the stress-strain curve, it was measured using a dynamic mechanical analyzer (DMA) since a slope of an elastic strain area in a straight line region is likely to be changed depending on a person who determines the straight line region. Further, after curing, the reactivity ratio of a vinyl group was measured by differential scanning calorimetry (DSC) to ascertain whether the respective samples were thoroughly cured. Each test was performed as follows.

Tensile Test

Figure 5:
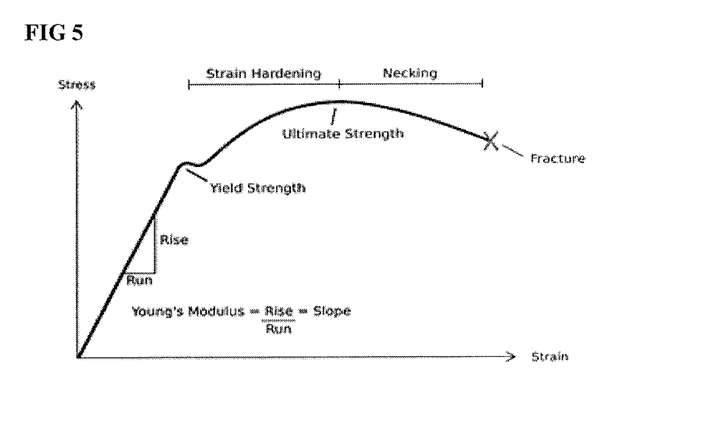
FIG. 5 illustrates a stress-strain curve reflecting measurement results in a tensile test.

Tensile strength was measured using a universal testing machine (UTM, H5KT, Hounsfield), and the test was performed as follows. After mounting a 100 N load cell, a grip was installed to perform measurement, and a sample was engaged with the grip, thereby measuring tensile elongation at a tensile test speed of 50 mm/min. Yield point was defined as the stress at which the sample began to deform plastically instead of elastically, as illustrated in the stress-strain curve in FIG. 5.

DMA for Elastic Modulus

The elastic modulus of the cured sample was measured using a dynamic mechanical analyzer (TA Instruments). A sample to be measured was cured using a hot press, and then thorough curing thereof was determined using DSC. The elastic modulus of the sample was observed at 25° C., elevating temperature at a rate of 10° C./min from (−40)° C. to 200° C.

DSC for Reactivity Ratio

Reactivity ratio was measured by a differential scanning calorimeter, which is a Perkin-Elmer diamond DSC. A predetermined amount of sample to be measured was collected, and the reactivity ratio of the sample was calculated by identifying a heating value, and elevating temperature at a rate of 10° C./min from 50° C. to 220° C. Here, since the reactivity ratio was a value from relative comparison with the sample before curing, the film, e.g., ACF, heating value of the same material was necessarily measured as follows.

Curing rate(%)=100×{Standard ACF ☐H(J/g)−☐H(J/g) of sample to be measured}/Standard ACF☐H (J/g)

Resistance and Reliability

Figure 6:
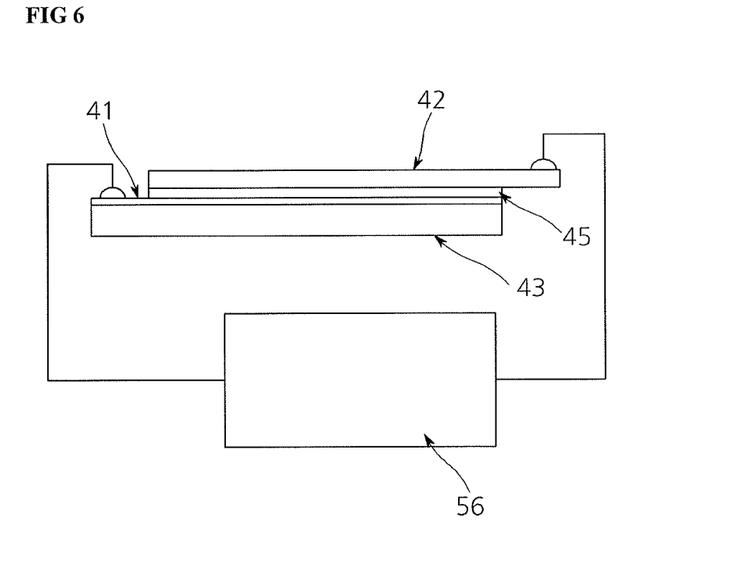
FIG. 6 illustrates a connection structure including an electrical connection material used in a resistance test of the examples.

The contact resistance of a sample bonded using a connecting film, i.e., ACF, was measured, as shown in FIG. 6, to ascertain whether the sample is conductive. The contact resistance was measured using 2000 Multimeter (Keithley) by applying a test current of 1 mA (see multimeter 56 in FIG. 6). First, the initial contact current of the sample was measured, and the contact current of the sample under high temperature and high humidity conditions or thermal shock was measured to evaluate reliability.

In the measurement under the high temperature and high humidity conditions, a change in the contact resistance at 85° C. and 85% RH for a certain period of time was observed. In the measurement under thermal shock, the contact resistance was measured to evaluate reliability, changing temperature from (−40)° C. to 100° C. The measurement was set to terminate a process of elevating temperature from (−40)° C. to 100° C. and then lowering back to (−40)° C. within 1 hour, i.e., each cycle took one hour.

Test Results

As shown in Tables 3 and 4, the electrical connection material of the example embodiments contains at least one vinyl group that includes peroxide generating free radicals by heat, and controls reaction rate using the peroxide to thereby decrease contact time up to 5 seconds, e.g., 3 seconds. Further, the electrical connection material exhibited cured material properties, e.g., an elastic modulus ranging from 10 to 500 MPa at 25° C., a tensile elongation of 100% or more, and a yield point strain of 10% or more in the stress-strain curve. Thus, the connection material according to embodiments secures excellent connection reliability (maintains contact resistance) in connecting the current collecting electrode on the cell and the ribbon. As shown in Table 4, the connection materials of Comparative Examples 1, 2 and 4 exhibited inferior contact resistance due to significant increase in contact resistance after 1,000 hours at 85° C./85% RH and after 1,000 cycles at −40° C./100° C., as compared with the initial contact resistance. Further, when the polymer resin includes only a urethane-modified acrylate resin in Comparative Example 3, i.e., without a thermoplastic resin, the connection material exhibited inferior contact resistance due to significant increase in contact resistance after 1,000 hours at 85° C./85% RH and after 1,000 cycles at −40° C./100° C. as compared with the initial contact resistance.

Further, as can be seen from Comparative Example 5, when the epoxy connection material does not have satisfactory material properties after curing, it secures connection reliability, but has a long connection time of 10 seconds and inferior productivity. Further, as can be seen from Comparative Example 6, even when the epoxy connection material is connected at a short connection time, it does not provide proper reliability.

TABLE 3

|  | Ex. 1 | Ex. 2 | Ex. 3 | Ex. 4 | Ex. 5 | Ex. 6 |
| --- | --- | --- | --- | --- | --- | --- |
| Connection conditions (° C.-sec-MPa) | 150-5-1 | 150-3-1 | 150-5-1 | 150-3-1 | 150-5-1 | 150-5-1 |
| Elastic modulus (MPa) | 45 | 45 | 300 | 300 | 400 | 450 |
| Tensile elongation (%) | 280 | 280 | 220 | 220 | 135 | 150 |
| Yield point strain (%) | 17 | 17 | 12 | 12 | 13 | 15 |
| Initial contact resistance (Ω) | 0.02 | 0.02 | 0.02 | 0.02 | 0.02 | 0.02 |

TABLE 3-continued

|  | Ex. 1 | Ex. 2 | Ex. 3 | Ex. 4 | Ex. 5 | Ex. 6 |
|---|---|---|---|---|---|---|
| Contact resistance after 1,000 h at 85° C./85% RH (Ω) | 0.02 | 0.02 | 0.02 | 0.02 | 0.02 | 0.02 |
| Contact resistance after 1,000 cycles at −40° C./100° C.(Ω) | 0.02 | 0.02 | 0.02 | 0.02 | 0.02 | 0.02 |

TABLE 4

|  | Comparative Example | | | | | |
|---|---|---|---|---|---|---|
|  | 1 | 2 | 3 | 4 | 5 | 6 |
| Connection conditions (° C.-sec-MPa) | 150-5-1 | 150-5-1 | 150-5-1 | 150-5-1 | 190-10-1 | 190-5-1 |
| Elastic modulus (MPa) | 1000 | 50 | 5 | 78 | 1300 | 1300 |
| Tensile elongation (%) | 24 | 65 | 350 | 210 | 5 | 5 |
| Yield point strain (%) | 7 | 8 | 20 | No yield point | No yield point | No yield point |
| Initial contact resistance (Ω) | 0.02 | 0.02 | 0.02 | 0.02 | 0.02 | 0.02 |
| Contact resistance after 1,000 h at 85° C./85% RH (Ω) | 1.3 | 10> | 10> | 0.21 | 0.02 | 10> |
| Contact resistance after 1,000 cycles at −40° C./100° C. (Ω) | 10> | 10> | 10> | 1.8 | 0.02 | 10> |

The electrical connection material according to the example embodiments may enhance adhesion strength and reliability, i.e., properly function, while requiring short contact time. The electrical connection material may be used excluding a bus bar in the current collecting electrode or as a 20 μm to 1 mm thin line. For example, since the current collecting electrode performs the same function as the conductive particles in the electrical connection material, an insulating adhesive film may be used excluding the conductive particle.

In contrast to example embodiments, a conventional electrical connection material, e.g., a material not including a urethane-modified acrylate resin in an amount of about 40-80 wt %, may require use of solder, i.e., having a melting point of about 183° C. or less, or use of an organic adhesive, i.e., a material having a low glass transition temperature, so deformation affecting the degree of stress may be correspondingly decreased, e.g., stress resulting from deformation between the cell and the ribbon may be reduced by reducing the elastic modulus of the adhesive to decrease glass transition temperature. However, such configuration of the adhesive may cause deterioration in reliability, as the adhesive components must be blended to guarantee reliability and property balance.

For example, a conventional connection material prepared by dispersing conductive particles in a thermosetting adhesive film, i.e., a film having a lower elastic modulus than solder and a lower Tg than the melting point of the solder, followed by thermal pressing, may require a long connection time. For example, an adhesive film containing epoxy resin and micro-capsulated imidazole particles may require a connection time of about 10 seconds. Further, conventional conductive films that require a shorter connection time than the epoxy adhesive, e.g., a conductive adhesive film containing acrylate or methacrylate having a vinyl group may exhibit reduced reliability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the example embodiments as set forth in the following claims.

What is claimed is:

1. An electrical connection material, comprising about 40 wt % to about 80 wt % of a urethane-modified acrylate resin, based on a total weight of the electrical connection material, the electrical connection material exhibiting, after curing, a tensile elongation of about 100% to about 500% and a yield point strain of about 10% to about 50% in a stress-strain curve,
wherein the electrical connection material further comprises at least one of an acrylonitrile butadiene copolymer and an ethylene-vinyl acetate copolymer.

2. The electrical connection material as claimed in claim 1, wherein the electrical connection material further exhibits an elastic modulus of about 10 MPa to about 500 MPa at about 25° C. after curing.

3. The electrical connection material as claimed in claim 1, wherein the electrical connection material exhibits a tensile elongation of about 200% to about 300% after curing.

4. The electrical connection material as claimed in claim 1, wherein the electrical connection material includes:
a polymer binder resin, the polymer binder resin including the urethane-modified acrylate resin and the at least one of the acrylonitrile butadiene copolymer and the ethylene-vinyl acetate copolymer;
a radical polymerizable compound;
an organic peroxide; and
conductive particles.

5. The electrical connection material as claimed in claim 4, wherein the electrical connection material includes:
about 70 wt % to about 80 wt % of the polymer binder resin, based on a total weight of the electrical connection material;
about 13 wt % to about 20 wt % of the radical polymerizable compound, based on a total weight of the electrical connection material;

about 1 wt % to about 5 wt % of the organic peroxide, based on a total weight of the electrical connection material; and about 1 wt % to about 5 wt % of the conductive particles, based on a total weight of the electrical connection material.

6. The electrical connection material as claimed in claim 4, wherein the polymer binder resin further includes an acrylic copolymer.

7. The electrical connection material as claimed in claim 1, wherein the polymer binder resin includes about 60 wt % to about 90 wt % of the urethane-modified acrylate resin.

8. The electrical connection material as claimed in claim 6, wherein the acrylic copolymer has a glass transition temperature ranging from about 50° C. to about 120° C.

9. The electrical connection material as claimed in claim 6, wherein the acrylic copolymer has an acid value ranging from of about 1 mgKOH/g to about 100 mgKOH/g.

10. The electrical connection material as claimed in claim 4, wherein the radical polymerizable compound includes at least one of a urethane(meth)acrylate oligomer, an epoxy(meth)acrylate oligomer, a polyester(meth)acrylate oligomer, a fluorine(meth)acrylate oligomer, a fluorene(meth)acrylate oligomer, a silicone(meth)acrylate oligomer, a phosphorus(meth)acrylate oligomer, a maleimide modified (meth)acrylate oligomer, an acrylate oligomer, a methacrylate oligomer, and a (meth)acrylate monomer.

11. The electrical connection material as claimed in claim 4, wherein the organic peroxide includes at least one of a ketone peroxide, a peroxy ketal, a hydroperoxide, a dialkyl peroxide, a diacyl peroxide, a peroxyester, and a peroxy carbonate.

12. The electrical connection material as claimed in claim 4, wherein the conductive particles include metal particles having Ni, Pd, Cu, Ag, Al, Ti, and/or Cr, and/or non-conductive particles coated with metal having Ni, Pd, Cu, Ag, Al, Ti, and/or Cr.

13. The electrical connection material as claimed in claim 1, wherein a total combined amount of the urethane-modified acrylate resin and the at least one acrylonitrile butadiene copolymer and ethylene-vinyl acetate copolymer in the electrical connection material ranges from about 70 wt % to about 80 wt %, based on a total weight of the electrical connection material.

14. The electrical connection material as claimed in claim 13, wherein the electrical connection material further comprises an acrylic copolymer, and the total combined amount of the urethane-modified acrylate resin, the at least one acrylonitrile butadiene copolymer and ethylene-vinyl acetate copolymer, and the acrylic copolymer in the electrical connection material ranges from about 70 wt % to about 80 wt %, based on a total weight of the electrical connection material.

15. An electrical connection material, the electrical connection material comprising about 40 wt % to about 80 wt % of a urethane-modified acrylate resin, based on a total weight of the electrical connection material, the electrical connection material exhibiting, after curing, an elastic modulus of about MPa 10 to about 500 MPa at about 25° C. and tensile elongation of about 200% to about 300% after curing, wherein the electrical connection material further comprises at least one of an acrylonitrile butadiene copolymer and an ethylene-vinyl acetate copolymer.

16. A solar cell module having a plurality of solar cells connected via a connection structure, the connection structure comprising:

at least one electrode on a surface of each solar cell;

a conductive wire connected to the electrodes on the plurality of solar cells; and an electrical connection material between the conductive wire and each of the electrodes, the electrical connection material comprising about 40 wt % to about 80 wt % of a urethane-modified acrylate resin, based on a total weight of the electrical connection material, and exhibiting, after curing, a tensile elongation of about 100% to about 500% and a yield point strain of about 10% to about 50% in a stress-strain curve;

wherein the electrical connection material further comprises at least one of an acrylonitrile butadiene copolymer and an ethylene-vinyl acetate copolymer.

17. The solar cell module as claimed in claim 16, wherein the electrical connection material is on a copper conductor, the copper conductor including on a surface thereof at least one of metal copper, rust-proofed copper or tin, solder, silver, and nickel.

* * * * *